United States Patent [19]

Takiguchi

[11] Patent Number: 5,696,512
[45] Date of Patent: Dec. 9, 1997

[54] DIGITAL/ANALOG (D/A) CONVERTING DEVICE WITH UNIT CURRENT GENERATING CIRCUIT HAVING DIFFERENTIAL SWITCHING AND REFERENCE VOLTAGE GENERATING CIRCUITS

[75] Inventor: Tomio Takiguchi, Tokyo, Japan

[73] Assignee: NEC Corporation, Tokyo, Japan

[21] Appl. No.: 577,146

[22] Filed: Dec. 22, 1995

[30] Foreign Application Priority Data

Dec. 28, 1994 [JP] Japan .................. 6-327220

[51] Int. Cl.$^6$ .................................. H03M 1/66
[52] U.S. Cl. .................................. 341/144; 341/136
[58] Field of Search ................... 341/144, 136; 326/27, 30, 82

[56] References Cited

U.S. PATENT DOCUMENTS 5,361,068  11/1994  Llewellyn .................. 341/144

*Primary Examiner*—Jeffrey A. Gaffin
*Assistant Examiner*—Peguy JeanPierre

*Attorney, Agent, or Firm*—Sughrue,Mion,Zinn,Macpeak & Seas, PLLC

[57] ABSTRACT

The D/A converting device disclosed includes a decoder, and a plurality of unit current generating circuits each having a differential switching circuit and a reference voltage generating circuit. The decoder receives a digital input value of n bits and outputs a plurality of complementary pairs of digital signals corresponding to the n bits of the digital input value. Each unit current generating circuit receives a complementary pair of digital signals from the decoder. The differential switching circuit has two complementary current output terminals, a bias voltage input and a reference voltage input. The two complementary current output terminals of the differential switching circuit are interconnected between corresponding ones of the unit current generating circuits with the interconnected points being made two complementary analog output terminals. Each of the analog output terminals and a power source terminal are connected to a load circuit, whereby analog output voltages corresponding to the digital signals inputted to digital input terminals of the n bits are obtained at the analog output terminals. This enables the speeding up of a settling time by reducing overshoot and undershoot when the analog output full-swings.

8 Claims, 14 Drawing Sheets

FIG. 4
PRIOR ART

| DIGITAL INPUT | | | DECODER OUTPUT | | | | | | | ANALOG OUTPUT |
|---|---|---|---|---|---|---|---|---|---|---|
| D3 | D2 | D1 | Din1 | Din2 | Din3 | Din4 | Din5 | Din6 | Din7 | Vout |
| 0 | 0 | 0 | 0 | 0 | 0 | 0 | 0 | 0 | 0 | $V_{DD}$ |
| 0 | 0 | 1 | 1 | 0 | 0 | 0 | 0 | 0 | 0 | $V_{DD} - RL \cdot I$ |
| 0 | 1 | 0 | 1 | 1 | 0 | 0 | 0 | 0 | 0 | $V_{DD} - 2RL \cdot I$ |
| 0 | 1 | 1 | 1 | 1 | 1 | 0 | 0 | 0 | 0 | $V_{DD} - 3RL \cdot I$ |
| 1 | 0 | 0 | 1 | 1 | 1 | 1 | 0 | 0 | 0 | $V_{DD} - 4RL \cdot I$ |
| 1 | 0 | 1 | 1 | 1 | 1 | 1 | 1 | 0 | 0 | $V_{DD} - 5RL \cdot I$ |
| 1 | 1 | 0 | 1 | 1 | 1 | 1 | 1 | 1 | 0 | $V_{DD} - 6RL \cdot I$ |
| 1 | 1 | 1 | 1 | 1 | 1 | 1 | 1 | 1 | 1 | $V_{DD} - 7RL \cdot I$ |

DIGITAL/ANALOG (D/A) CONVERTING DEVICE WITH UNIT CURRENT GENERATING CIRCUIT HAVING DIFFERENTIAL SWITCHING AND REFERENCE VOLTAGE GENERATING CIRCUITS

BACKGROUND OF THE INVENTION (1) Field of the Invention

The present invention relates to a digital-to-analog (D/A) converting device, and more particularly to a D/A converting device which enhances analog output compliance and meets with the need for speeding up a settling time by the reduction of overshoot and undershoot when the analog output swings.

(2) Description of the Related Art

A conventional D/A converting device of the kind to which the present invention relates, is proposed in, for example, Japanese Patent Application Kokai Publication No. Hei 4-310020, The conventional D/A converting device proposed is first explained with reference to FIGS. 1 and 2.

Each of the configurations of the devices shown in FIGS. 1 and 2 is a conventional 3-bit input D/A converting device formed on an N-type semiconductor substrate, A first conventional D/A converting device shown in FIG. 1 is constituted mainly by a decoder 51 and seven unit current generating circuits (52A–52G). The decoder 51 receives signals from 3-bit digital input terminals (D1–D3) and outputs seven pairs of complementary digital output signals (Din1, inverted Din1) to (Din7, inverted Din7). Each of the unit current generating circuits (52A–52G) determines, based on the paired complementary decoder output signals, from which of the complementary current output terminals (IOx, inverted IOx (x=1–7)) the constant current value is to be drawn.

Next, as shown in FIG. 2, the internal circuit of each of the unit current generating circuits (52a–52G) is constituted by an N-type constant current MOS transistor MNC1 which allows the constant current I to flow therein according to a gate bias potential $V_{BO}$, a differential pair of N-type MOS switching transistors MNB1 and MNB2 whose sources are commonly connected to a drain of the N-type constant current MOS transistor MNC1, an N-type fixed bias MOS transistor MNA1 whose source is connected to a drain of the N-type MOS switching transistor MNB1 and whose gate is biased by a constant potential $V_{ref}$, and an N-type fixed bias MOS transistor MNB2 whose source is connected to a drain of the N-type MOS switching transistor MNB2 and whose gate is biased by the constant potential $V_{ref}$, with the drain electrodes of these N-type fixed bias MOS transistors MNA1 and MNA2 being used respectively as current output terminals 58A and 58B.

Also, the gates of the N-type MOS switching transistors (MNB1, MNB2) receive respectively the complementary digital output signals (DinX, inverted DinX (X=1–7)) from the decoder 51. Further, each of the gate electrodes of the N-type fixed bias MOS transistors (MNA1, MNA2) is connected to a reference voltage input terminal 64B to which the constant potential $V_{ref}$ is provided.

The constant current generating circuits (52A–52G) internally operates such that, when the digital output signal (DinX, (X=1–7)) of the decoder 51 is a digital signal "1" and the complementary signal (inverted DinX, (X=1–7)) of the digital output signal is a digital signal "0", the transistor MNB1 turns ON and the transistor MNB2 turns OFF so that the constant current I controlled by the transistor MNC1 operates so as to draw the current from the side of the current output terminal 58A.

Inversely, when the digital output signal (DinX, (X=1–7)) is a digital signal "0" and the complementary signal (inverted DinX, (X=1–7)) of the digital signal output is a digital signal "1", it follows that the current is drawn from the side of the current output terminal 58B.

The complementary pair current output terminals (58A, 58B) of each of the constant current generating circuits (52A–52G) are respectively connected to an analog output terminal 54 and its complementary analog output terminal 55 and, by connecting an output load resistor 62A having a resistance value $R_L$ between the analog output terminal 54 and the power source terminal 6, it is enabled to obtain at the analog output terminal 54 an analog output voltage $V_{out}$ corresponding to the digital input value.

The output voltage thus obtained may be expressed by the equation as follows:

$$V_{out}=V_{DD}-R_L \cdot I(Din1+Din2+Din3+Din4+Din5+Din6+Din7).$$

In the same way as above, the inverted analog output voltage $V_{out}$ can be obtained at the analog output terminal 55.

Further, where D1 is the least significant bit (LSB) and D3 is the most significant bit (MSB), the decoder 51 follows the truth table as shown in FIG. 4 as to the relationship between the inputs (D1–D3) and the outputs (Din1–Din7).

Now, with reference to the circuit diagram shown in FIG. 5, a second conventional D/A converting device whose internal circuitry of unit current generating circuits (51A–52G) is as shown in FIG. 6 is explained. This device is proposed under the title "A 100 MHz CMOS DAC for Video-Graphic Systems" in IEEE Journal of Solid-State Circuits, Vol. 24, No. 3, June 1989, pp. 635–639.

The overall circuit blocks of this second conventional D/A converting device are the same as those of the first conventional device except that the second conventional device has a constant potential $V_{B1}$.

However, each of the unit current generating circuits (52A–52G) eliminates the N-type fixed bias MOS transistors (MNA1, MNA2) shown in FIG. 2 which are biased by the reference potential $V_{ref}$, and is constituted by two differential switching circuits consisting of a first differential switching circuit 15 in which the drains of the MOS switching transistors (MNB1, MNB2) are respectively connected to the current output terminals (158A, 158B) and a second differential switching circuit 16.

The second differential switching circuit 16 is constituted by two P-type fixed bias MOS transistors (MPA1, MPA2) whose sources are connected to the power source terminals 6 and whose gates receive the potential $V_{ref}$, an N-type constant current MOS transistor MND1 for generating the current $I_B$ whose source is connected to the second power source terminal 7, for example, a ground terminal (GND) and whose gate receives the potential $V_{B1}$, and N-type MOS switching transistors (MNE1, MNE2) whose drain-source paths are respectively connected between the drains of the P-type fixed bias transistors (MPA1, MPA2) and the drain of the N-type constant current MOS transistor (MND1), and gates are connected to the digital switching signal lines (169A, 169B) which constitute outputs of the decoder 51.

The above differential switching circuit 16 operates such that, whereas the digital signal transmitted to the digital switching signal input lines (169A, 169B) is a full-swing signal ranging between the potential $V_{DD}$ of the first power source terminal 6 and the potential $V_{SS}$ of the second power source terminal 7, the signal inputted to the digital switching signal input lines (169A', 169B') is a signal of a small amplitude with the level thereof being within the full-swing level. Because of the potential difference ($V_{DD}$-$V_{SD}$) across the source and the drain caused by the constant current $I_B$ that flows to the P-type fixed bias transistors (MPA2, MPA1), there is produced a potential ($V_{DD-VSD}$). As a consequence, the amplitude level of the digital switching signals (169A', 169B') is reduced by the $V_{SD}$.

As the digital/analog converting operation of this second conventional D/A converting device is fully the same as that of the first conventional D/A converting device, the explanation is not repeated here.

Lastly, a third conventional D/A converting device is explained with reference to FIGS. 7 and 8. This device is disclosed in U.S. Pat. No. 4,831,282.

The overall configuration of the third conventional D/A converting device is shown in FIG. 7, which is constituted by unit current generating circuits (102A–102G) and a decoder 101 which eliminates the inputs DinX at one side of the digital switching signal inputs DinX and the inverted DinX {X=1,2, ... 7} from the arrangement in the decoder 51.

Each of the unit current generating circuits (102A–102G) is internally arranged such that the N-type fixed bias MOS transistors (MNA1, MNA2) are eliminated from the arrangement shown in FIG. 2, the drains of the N-type MOS switching transistors (MNB1, MNB2) are respectively connected to the complementary current output terminals (258A, 258B), and the gate of the N-type MOS switching transistor MNB1 is connected to the reference voltage input terminal 114 (shown in FIG. 7) to which the constant bias potential $V_{ref}$ is provided from the digital switching signal input 69B ((DinX) X=1,2,3, ... 7).

The digital/analog conversion operation follows the truth table of FIG. 4 and is the same as that in the first conventional D/A converting device. Thus, the explanation therefor is not repeated here.

The advantages in the first conventional converting device shown in FIGS. 1 and 2 are that, since the N-type fixed bias MOS transistors (MNA1, MNA2) are interposed, it is possible to prevent the switching noise from appearing at the analog output terminal 54 which noise occurs in the N-type MOS switching transistors (MNB1, MNB2) when the complementary digital signals are inputted to the digital switching signal input lines (69A, 69B).

On the other hand, however, at the reference voltage input bias line 61 (see FIG. 1), because of the abrupt change in the complementary digital signals inputted to the digital switching signal input lines (69A, 69B), there occurs a short period change in the reference voltage $V_{ref}$ caused by the switching noise that passes around through the gate/drain capacitances ($C_{GDB1}$, $C_{GDB2}$) of the N-type MOS switching transistors (MNB1, MNB2) and the source/gate capacitances ($C_{GSA1}$, $C_{GSA2}$) of the N-type fixed bias MOS transistors (MNA1, MNA2).

For the potential of the above reference voltage input bias line 61 to change, it has taken a certain period of time until this potential returns to the steady-state potential $V_{ref}$ due to the time constant produced by the line impedance of the reference voltage input bias line 61, the gate capacitances of the N-type fixed bias MOS transistors (MNA1, MNA2) and the impedance of the bias source connected to the reference voltage input terminal 64.

The delay of the reference voltage input bias line 61 till it is restored to the steady-state has also caused the delay of the settling time of the common source node 20B shown in FIG. 2. The settling time of the common source node 20B is delayed because the potential of the common source node 20B is determined by $V_{ref}$-($V_{GSA1}$, $V_{GSA2}$).

($V_{GSA1}$, $V_{GSA2}$) is a gate/source voltage which is produced when the current value I determined by the N-type constant current MOS transistor MNC1 flows to the N-type fixed bias MOS transistors MNA1 and MNA2, which may be expressed as:

$$V_{GSA1}, V_{GSA2} = \sqrt{\frac{2I}{K\left(\frac{W}{L}\right)}} + V_T$$

In this equation, even when the current value I undergoes a slight change, the gate/source voltage $V_{GSA1}$ or $V_{GSA2}$ remains almost constant as it is proportional to the square root of the current.

That is, when either of the MOS switching transistors (MNB1, MNB2) is completely ON and the other is completely OFF, the settling waveform at the common source node 20B shown in FIG. 2 shows a settling waveform of the potential $V_{ref}$ of the reference voltage input bias line 61B and a transient response almost the same although an off-set is present. On the other hand, since the change at the common source node 20B causes the drain potential of the N-type constant current MOS transistor MNC1 to change, the constant current value I is changed though slightly, which is caused by the early-voltage effect of the N-type constant current MOS transistor MNC1.

Also, since the reference voltage input bias line 61 shown in FIG. 1 is commonly connected to all of the unit current generating circuits (52A–52G), the potential change is caused to take place at the node 20B of the separate unit current generating circuit(s) (52A–52G) in which there are no changes in the digital signals of the digital switching signal input lines (69A, 69B).

The problem resulted from the above is the delay of the settling of the analog output voltage $V_{out}$ which appears as the sum of the current values of the unit current generating circuits (52A–52G) corresponding to the digital input (D1–D3). This timing is shown in FIG. 3. There is a trend that each of the nodes 22B and 23B abruptly changes to the GND side when the N-type MOS switching transistors (MNB1, MNB2) change from OFF to ON, and conversely changes gently when the same transistors change from ON to OFF.

The reason for the above is that, when the N-type MOS switching transistor (MNB1 or MNB2) changes from OFF to ON, the charge at the node 82 or the node 83 is drawn to the GND side at the current value I and, as a consequence, the potential change at the nodes (82, 83) is completed in a short time.

On the other hand, when the N-type MOS transistor (MNB1 or MNB2) changes from ON to OFF, the operation takes place at the saturation region, and the charging is made through the N-type fixed bias MOS transistor (MNA1 or MNA2) whose impedance is very high, so that the potential change at the node (82 or 83) takes time.

The above potential change at the nodes (82, 83) causes the potential $V_{ref}$ bias line to be changed through the gate/source capacitances ($C_{GSA1}$, $C_{GSA2}$) of the N-type fixed bias MOS transistors (MNA1, MNA2), and also causes the potential at the node 20B to be changed. The potential changes such as those of the reference voltage input bias line 61 and the node 20B, that is, the spike noise, are influenced by a potential change with larger dV/dt between the potential changes at the nodes (82, 83) respectively at the times t0, t1 and t2, so that a large spike noise inevitably occurs at the GND side.

The above spike noise acts in the direction to make the control current I smaller for a short time of the constant current MOS transistor MNC1 so that there is a trend that, although no overshoot at the falling time is present, the waveform of the analog output $V_{out}$ makes the falling time large. However, at the rising time of the analog output $V_{out}$, the charging is effected through the output load resistor 62A from the $V_{DD}$ side so that no influence is received from the change in the $V_{ref}$ bias line 61.

For reducing the spike noise of the above $V_{ref}$ bias line 61 so as to make the settling time faster for the analog output $V_{out}$, there is a proposed D/A converting device under the title "A 10 bit 80 MHz Glitchless CMOS D/A converter" in CICC' 91, Technical Paper 26.5.1–26.5. 4, in which the $V_{ref}$ bias line 61 is connected to the power source terminal. However, the connection of the $V_{ref}$ bias line to the power source terminal 6 results in about $V_{DD}-V_{ref}+V_{TH}$ ($V_{TH}$ being the absolute value of the threshold voltage of the transistors (MNA1, MNA2)). The defect therein is that the analog output compliance (the maximum amplitude of the analog output $V_{out}$ which can maintain the accuracy of the analog output current) is made so small as to be within the 1 volt of the threshold value $V_{TH}$ of the transistors.

Further, when the reference voltage $V_{ref}$ is confined within the power source voltage $V_{DD}$ in order to increase the analog output compliance, there is a problem that, it is required to provide, as a reference voltage source to be connected to the reference voltage input terminal 64, a voltage follower type amplifier which is of a very wide band and of low impedance or a separate power source in addition to the power source voltage $V_{DD}$.

On the other hand, in the second conventional device, as the report entitled "A 100 MHz CMOS DAC for Video Graphic System" explains, a two-stage type differential switch is used so as to avoid the influence from the change in the reference voltage input bias line 61 shown in FIG. 6.

However, the problems in the above are that the differential switching circuit 16 causes an increase in the power consumption and that the provision of such differential switching circuit newly requires three element transistors thereby increasing the chip area.

A D/A converting device disclosed in the U.S. Pat. No. 4,831,282 is an example which attempts to solve the problems as in the above first and second conventional devices. FIG. 8 shows a circuit diagram thereof. With reference to FIG. 9 showing the timing chart of the operation thereof, the potential change at the node 20 is as large as about $|V_{DD}-V_{ref}|$, and further this potential change has characters such that it does not return to the steady-state in a short time but the potential is shifted by the ON state or OFF state of the MOS switching transistor MNB2. The change at the node 220 is normally in such a large value as about 1 volt so that, through the source/gate capacitance $C_{GSB2}$ or the drain/source capacitance $C_{GDC1}$, the reference voltage input bias line 61 causes the fixed bias line 67 to change. Whereas, in the first and second conventional devices, the potential change at the node 20 shown in each of FIGS. 2 and 6 appears as the spike noise at several hundreds mV, in the third conventional device shown in FIG. 8, the potential change is as large as the 1 volt shift, which results in the defect that the fixed bias line 117 is also shifted about several tens of mV.

In the case of the spike noise, since the bias voltage restores to almost the original bias state, the change of the current value I restores to the original state within the time period in which the spike noise is appearing. However, as shown in FIG. 12, the potential shift at the node 220 causes the potential of the constant bias line 117 to change, and it is generally understood that this potential change restores to the original bias $V_{BO}$ by the time constant determined by the line impedance of the constant bias line 117, the impedance of the bias source and the gate capacitance of the constant current MOS transistor MNC1.

As a result, as shown by $$I=K\cdot(W/L)\cdot(V_{GS}-V_T)^2$$

(wherein K is transconductance of the transistor MNC1; W,L is a gate size of the transistor MNC1; $V_{GS}$ is a gate/source voltage; and $V_T$ is a threshold voltage), since the value I changes with the square of the gate/source voltage $V_{GS}$, the defect is that the rising of the analog output takes place slower than that in the first and second conventional devices so that, although the number of the required elements may be reduced, the device is not suited to the speeding up of the rate of conversion.

In order to overcome the above problems, it is necessary that the impedance of the bias line connected to the constant bias input terminal 110B be made low and that a wide band amplifier be provided. However, at the digital/analog conversion speed in the order of 100 MHz, the band of this wide band amplifier becomes about 300 MHz which is three times the conversion speed and, since the low impedance is necessary, it is considerably difficult to realize the amplifier on a silicon semiconductor substrate.

SUMMARY OF THE INVENTION

An object of the present invention is, therefore, to overcome the problems existing in the conventional D/A converting devices and to provide an improved D/A converting device.

According to one aspect of the invention, there is provided a D/A converting device comprising:

a first power supply terminal having a first potential and a second power supply terminal having a second potential which is lower than the first potential;

a decoder circuit which receives an n (n being a natural number larger 0, n>0) bit digital input value of digital input signals inputted to input terminals and outputs a plurality of complementary pairs of digital signals (Dinx,Dinx) corresponding to the digital input values of the n bits;

a plurality of unit current generating circuits the number of which is same as that of the complementary pairs of the digital signals and which respectively receive the plurality of complementary pairs of digital signals, each of the unit current generating circuits comprising:

a differential switching circuit having a complementary pair of input terminals to which one of the plurality of complementary pairs of the digital signals are inputted, a complementary pair of current output terminals, at least one bias voltage input terminal, and a reference voltage input terminal; and a reference voltage generating circuit connected to the differential switching circuit;

a complementary pair of analog output terminals to each of which corresponding current output terminals of the plurality of unit current generating circuits are commonly connected; and a pair of load circuits respectively connected between the complementary pair of the output terminals and one of the first and second power supply terminals, whereby analog output voltages corresponding to the n bit digital input value of the digital input signals applied to the input terminals are obtained at the complementary pair of the analog output terminals.

BRIEF DESCRIPTION OF THE DRAWINGS

The above and other objects, features and advantages of the present invention will be apparent from the following description of preferred embodiments of the invention explained with reference to the accompanying drawings, in which:

FIG. 4 is a truth table of inputs and outputs of a decoder of the conventional D/A conversion device;

PREFERRED EMBODIMENTS OF THE INVENTION

Now, preferred embodiments of the present invention are explained with reference to the drawings.

First, a D/A converting device of a first embodiment according to the invention is explained with reference to FIGS. 10, 11 and 12.

The first embodiment relates to a D/A converting device for converting a 3-bit digital signal to a corresponding analog signal.

Figure 10:
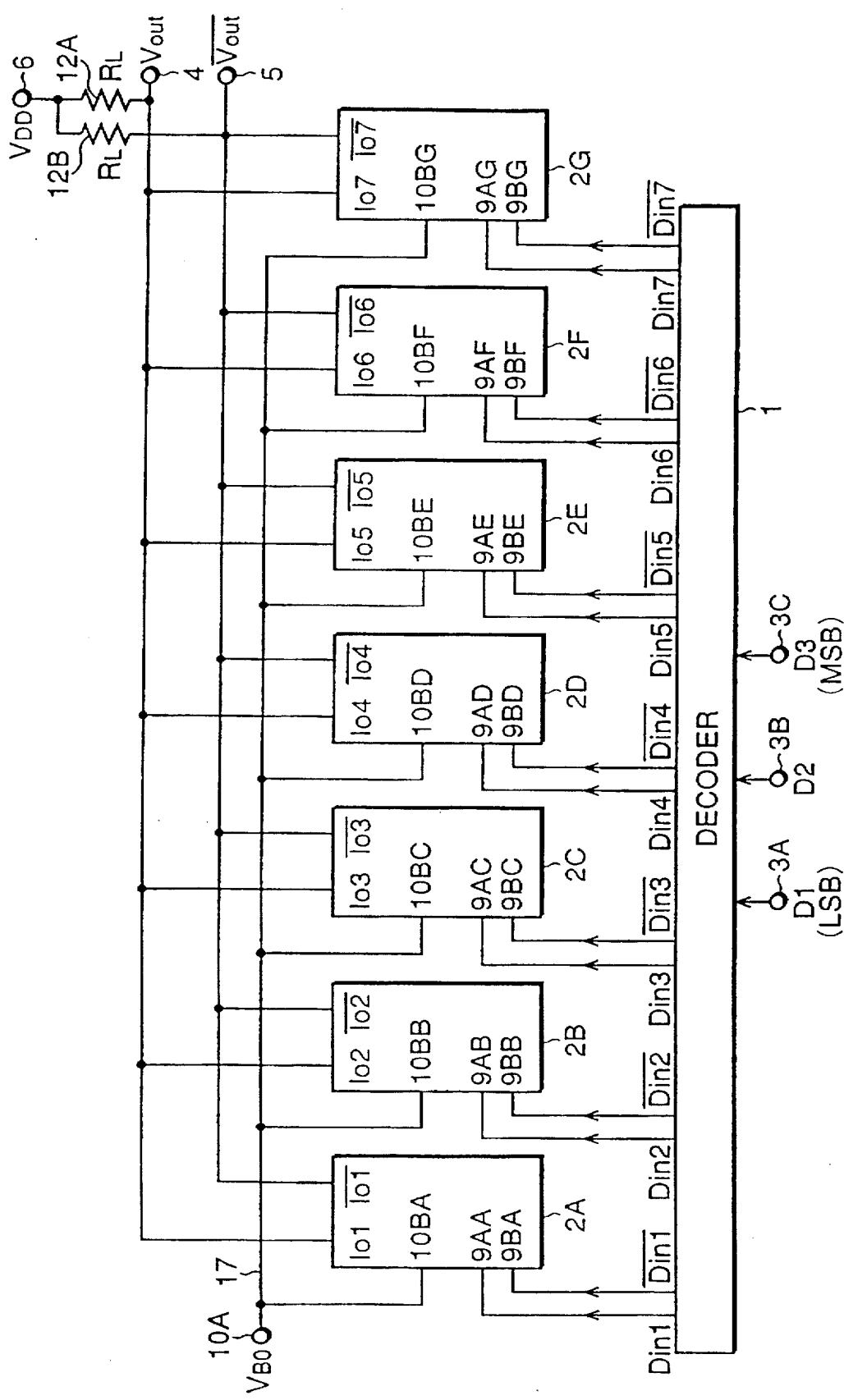
FIG. 10 is an overall block diagram of a D/A conversion device of a first embodiment according to the invention.

FIG. 10 shows, in a block diagram, showing the overall D/A converting device of the first embodiment.

As shown in FIG. 10, when the digital signals D1–D3 are inputted to the decoder 1 through the 3-bit digital signal input terminals 3A–3C (the terminal 3A being for the least significant bit and the terminal 3C being for the most significant bit), the decoder 1 operates exactly the same as the decoder 51 as in the conventional devices and is configured so as to output the seven paired-complementary signals (DinX and inverted DinX (X=1–7)) in accordance with the truth table 4.

The output signals are respectively inputted to the digital switching signal input lines (9A, 9B) within the unit current generating circuits (2A–2G). By the digital signal values of the digital switching signals (9A, 9B), the currents by the value I generated at the unit current generating circuits (2A–2G) are outputted as flow-in current from either one of the current output terminals (8A, 8B).

Also, the corresponding current output terminals (8A, 8B) of the unit current generating circuits (2A–2G) are connected to the same analog output terminal 4 and the same inverted analog output terminal 5, respectively, and further an output load resistor 12A having a resistance value $R_L$ is connected between the analog output terminal 4 and the power source terminal 6. An analog output voltage $V_{out}$ is obtained from the analog output terminal 4.

Now, the internal circuit of each of the unit current generating circuits (2A–2G) shown in FIG. 10 is explained hereunder.

Figure 11:
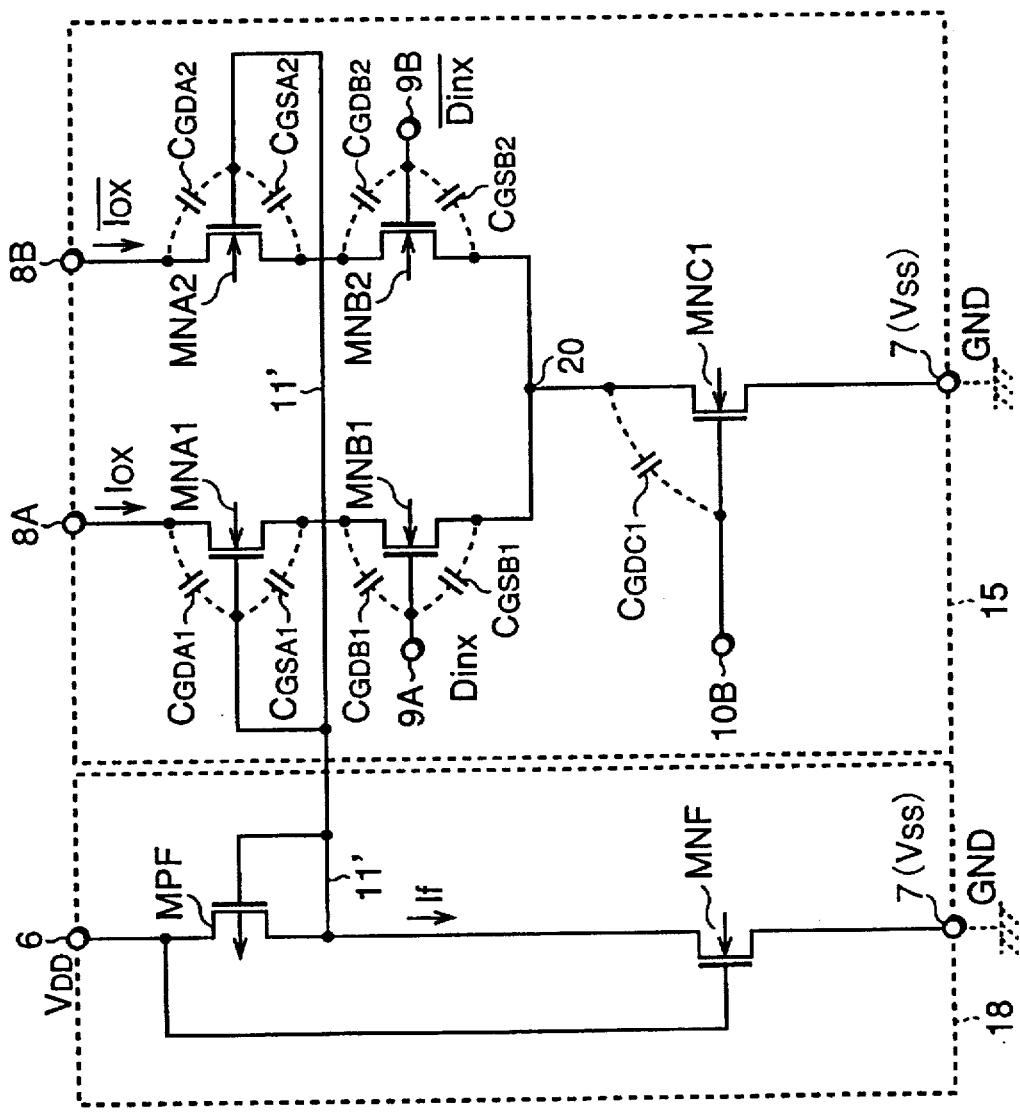
FIG. 11 is a circuit diagram of a unit current generating circuit of the D/A conversion device shown in FIG. 10.

As shown in FIG. 11, each of the unit current generating circuits (2A–2G) has a differential switching circuit 15 and a reference voltage generating circuit 18.

First, the configuration of the differential switching circuit 15 is explained.

The differential switching circuit 15 is constituted by an N-type constant current MOS transistor MNC1 whose gate is connected to the constant bias input terminal 10B biased by the potential $V_{BO}$ and whose source is connected to the second power source terminal ($V_{SS}$), that is, the ground terminal 7, and two N-type MOS switching transistors (MNB1, MNB2) whose sources are connected to the node 20 which is formed by the drain of the N-type constant current MOS transistor MNC1. Also, the sources of the N-type fixed bias MOS transistors (MNA1, MNA2) are respectively connected to the drains of the N-type MOS switching transistors (MNB1, MNB2) and, on the other hand, the drains thereof are respectively used as the current output terminals (8A, 8B).

The gates of the N-type MOS transistors (MNA1, MNA2) are connected to the reference voltage output node of the reference voltage generating circuit 18 through one reference voltage input bias line 11'. In the same way, the gates of the N-type MOS switching transistors (MNB1, MNB2) are connected to the paired digital outputs (DinX, inverted DinX) respectively through the digital switching signal input lines (9A, 9B).

Next, the configuration of the reference voltage generating circuit 18 is explained.

The reference source circuit 18 is constituted by a P-type constant current source MOS transistor MPF whose source is connected to the first power source terminal 6 and whose drain and gate are connected to the reference voltage input bias line 11', and an N-type load MOS transistor MNF whose drain is connected to the reference voltage input bias line 11' and whose source is connected to the second power source terminal 7, that is, the ground terminal 7 with the remaining gate source being provided with the potential close to the power source voltage $V_{DD}$ of the first power source terminal 6.

Next, the operation of the above circuit is explained. When the digital switch signal is such that DinX=1 and the complementary DinX=0, the transistor MNB1 is ON and the transistor MNB2 turns to OFF, so that the current I shown in the undermentioned equation is drawn from the side of the current output terminal 8A according to the bias voltage $V_{BO}$ inputted to the constant bias input terminal 10B.

$$I=(1/2) \cdot K \cdot (W/L)(V_{BO}V_{TH})^2$$

wherein K is a transconductance of the transistor MNC1, (W/L) is a transistor size ratio, and $V_{TH}$ is a threshold voltage of the transistor MNC1.

Inversely, when the digital switch signal is such that DinX=0, the inverted DinX=1, the current value I is drawn from the side of the current output terminal 8B.

Further, the decoder 1 operates following the same truth table as for the conventional example (FIG. 4).

The foregoing explanation covers the arrangements of the 3-bit D/A converting device of the first embodiment.

Figure 12:
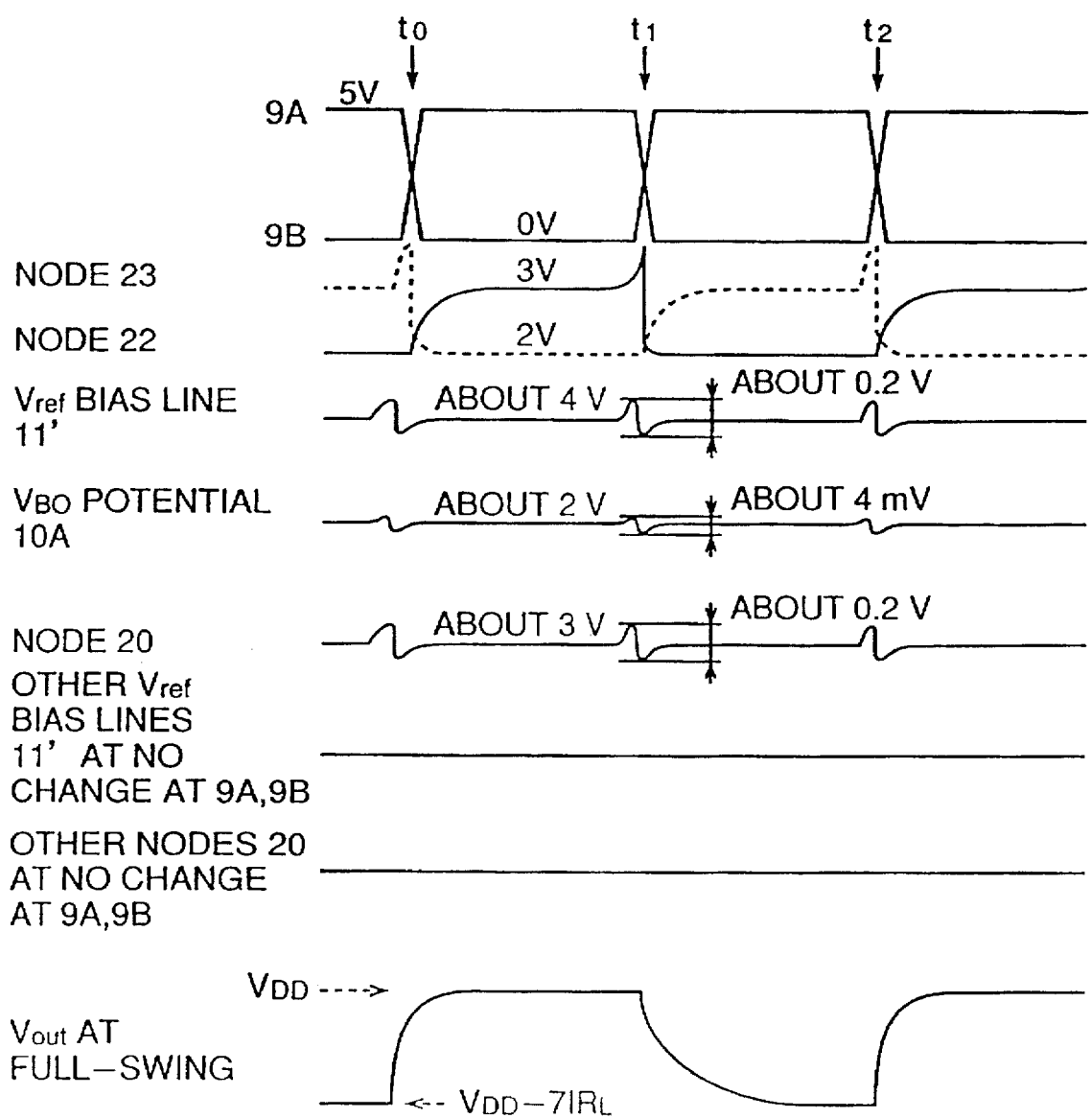
FIG. 12 is a diagram showing potential changes during D/A conversion operations at various nodes in the unit current generating circuit shown in FIG. 11.

Next, FIG. 12 shows the potential changes to take place at each of the related nodes.

Figure 3:
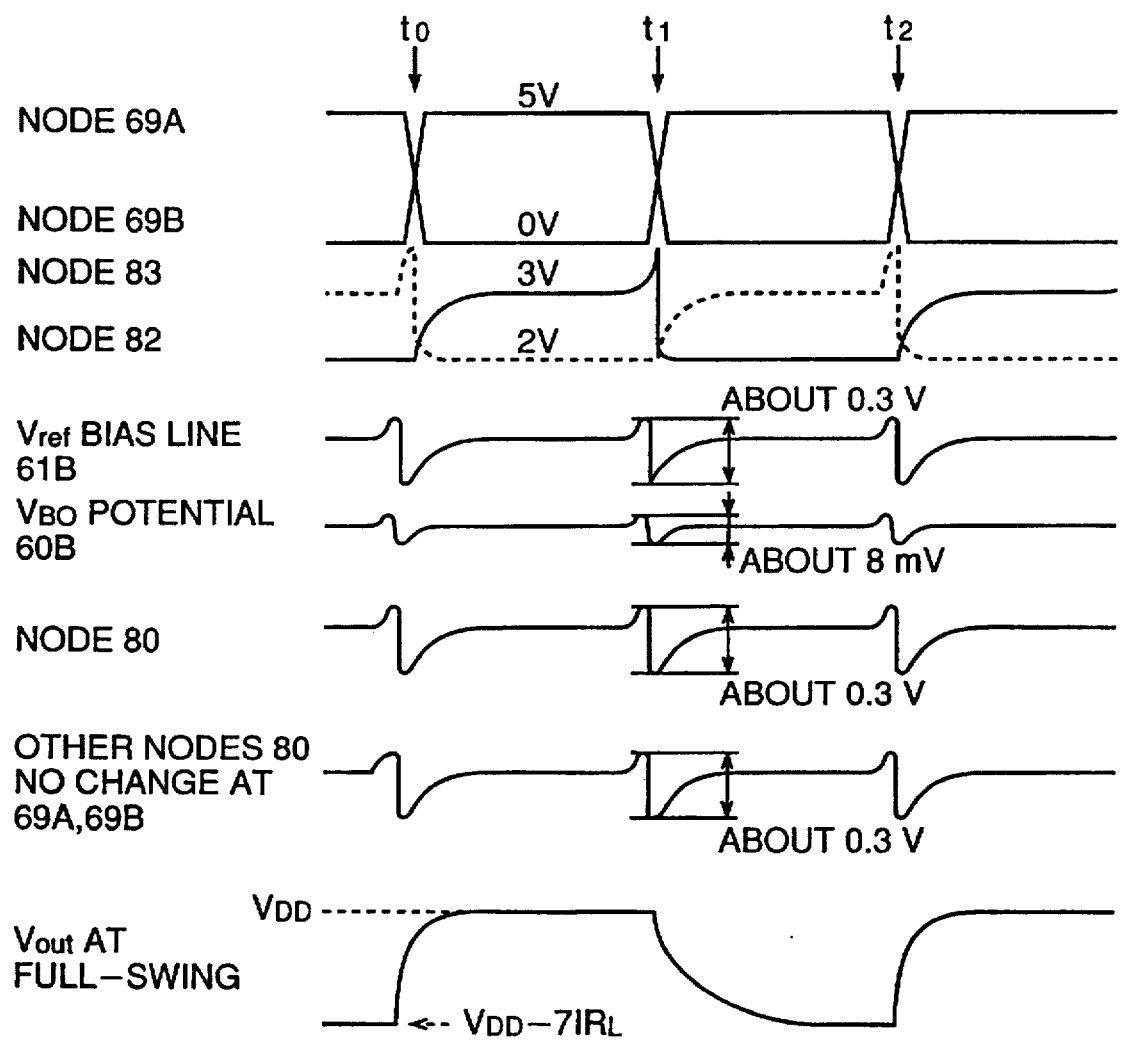
FIG. 3 is a diagram showing potential changes during D/A conversion operations at various nodes in the unit current generating circuit shown in FIG. 2.
Figure 5:
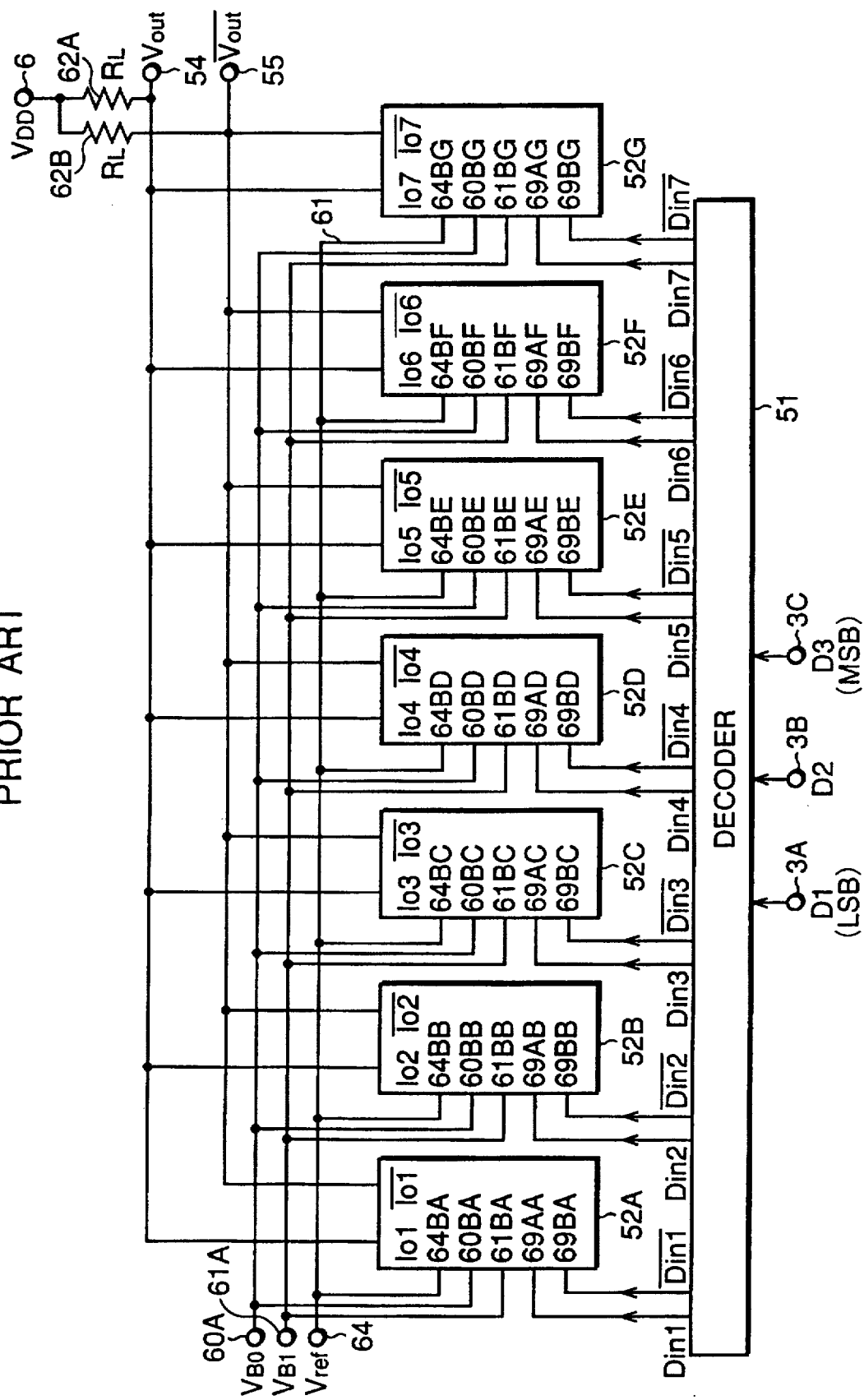
FIG. 5 is an overall block diagram of a second conventional D/A conversion device.
Figure 6:
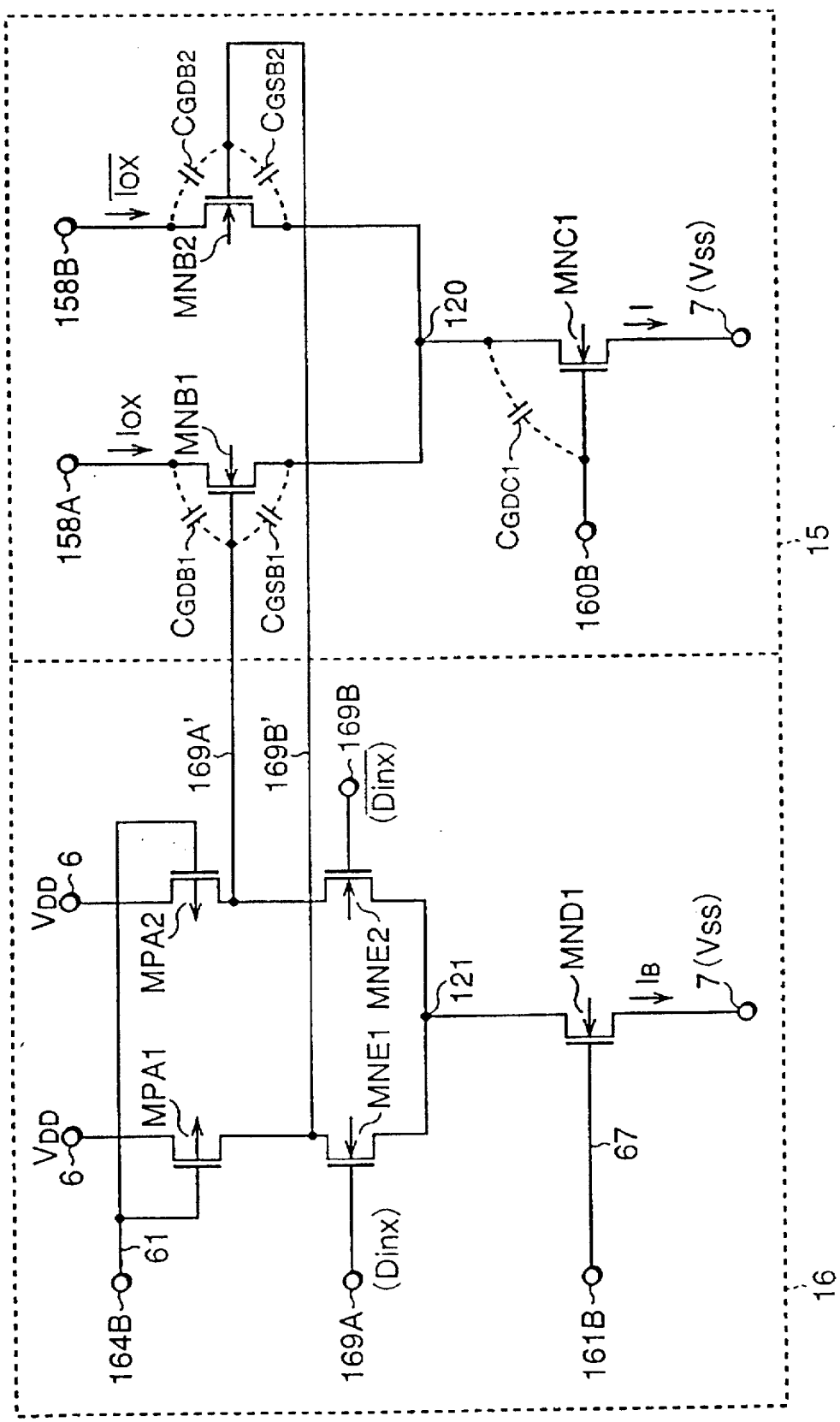
FIG. 6 is a circuit diagram of a unit current generating circuit in the conventional D/A conversion device shown in FIG. 5.
Figure 7:
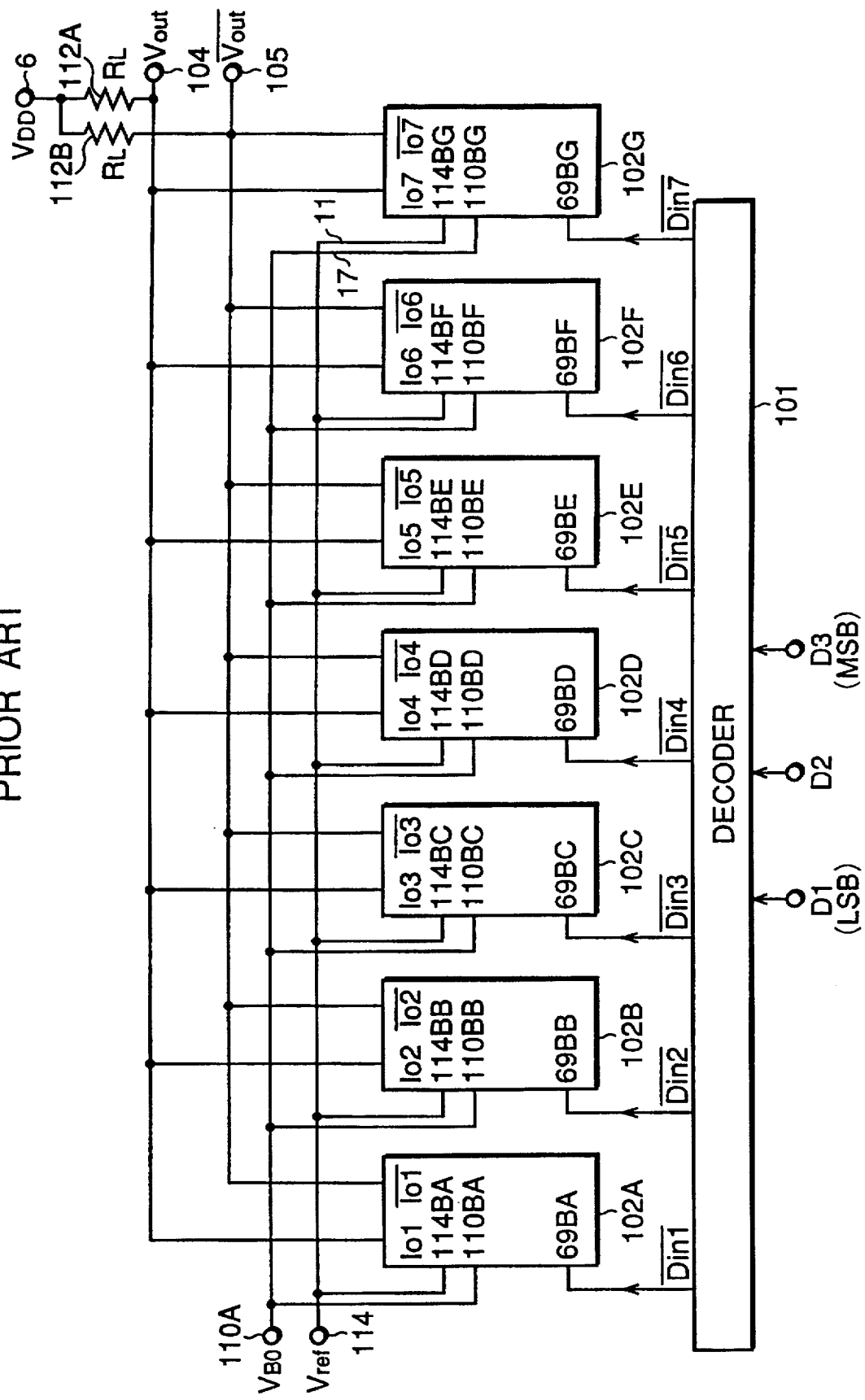
FIG. 7 is an overall block diagram of a third conventional D/A conversion device.
Figure 8:
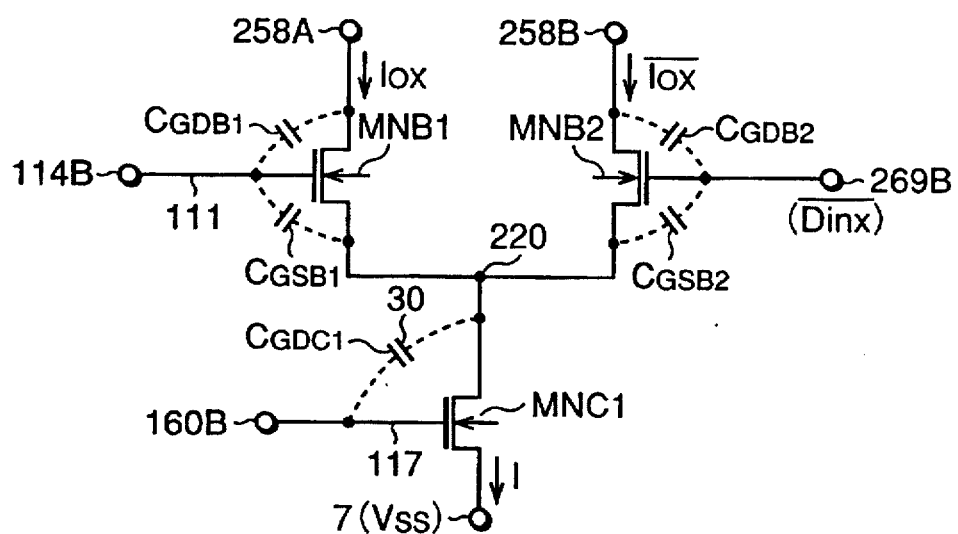
FIG. 8 is a circuit diagram of a unit current generating circuit in the conventional D/A conversion device shown in FIG. 7.
Figure 9:
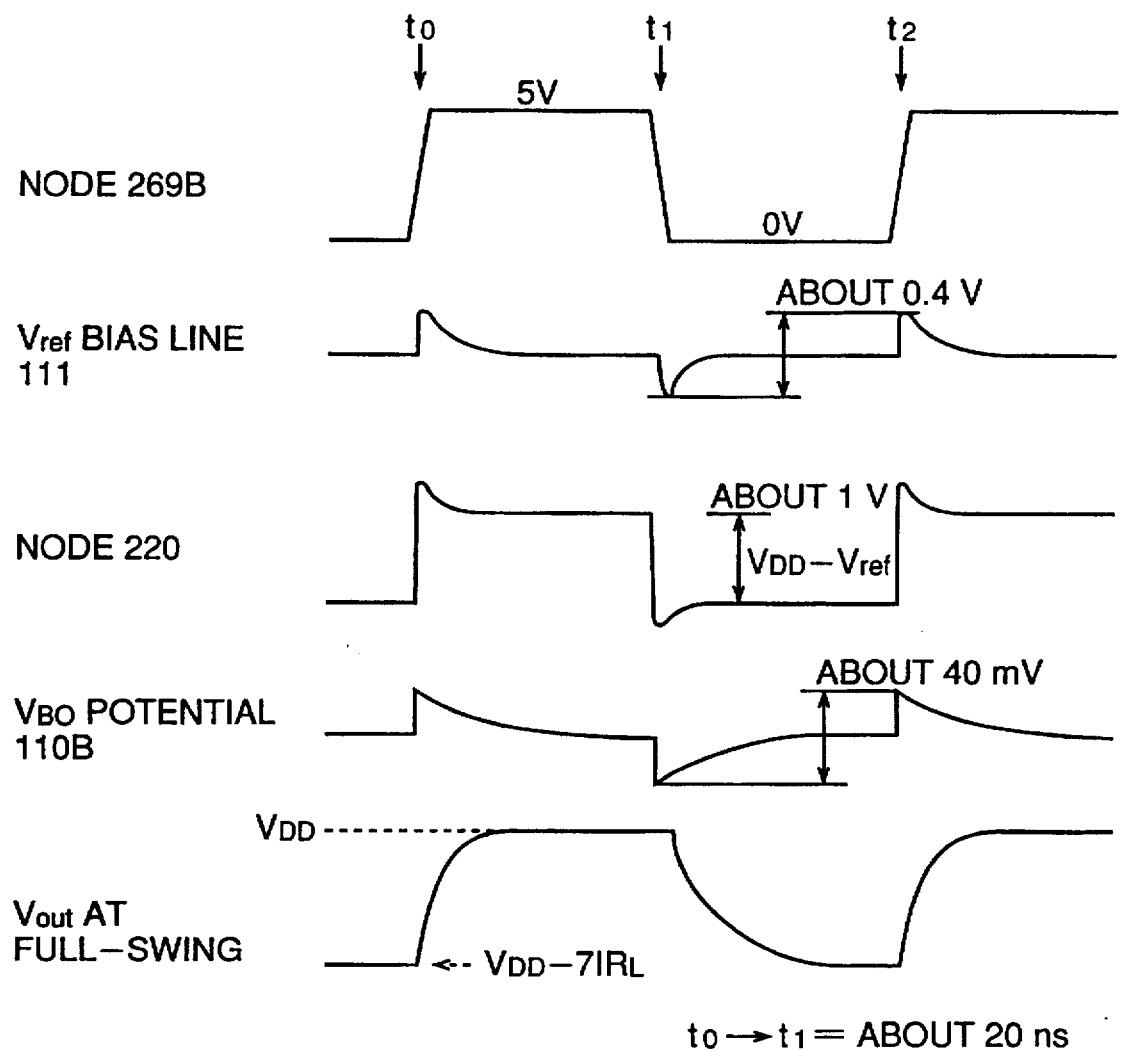
FIG. 9 is a diagram showing potential changes during D/A conversion operations at various nodes in the unit current generating circuit shown in FIG. 8.

The time from t0 to the time t1 is shown in a time scale of about 20 ns in the same way as in each of FIG. 3 and FIG. 9.

As seen in the bias changes of the reference voltage input bias line 11 shown in FIG. 3 with respect to the reference voltage input bias line 11', the reference voltage generating circuit 18 has the effect of suppressing the spike noise which, as being inherent to the differential switching circuit 15, occurs in a large value at the GND side.

The reason for the above is that, when the gate and the drain of the P-type constant current source MOS transistor MPF are interconnected, there is produced a negative feedback effect of the P-type constant current source MOS transistor MPF, so that the output impedance (1/gmf, wherein gmf being a transconductance of the transistor MPF) is reduced to about several kΩ—several hundreds Ω. Further, since the reference voltage generating circuit 18 can be positioned near the differential switching circuit 15, the influence by the line impedance of the reference voltage input bias line 11' can be suppressed to a minimum.

As an example, by comparing the time constant of the reference voltage input system according to the invention with that in the conventional example, the detailed values are as given below.

First, the examples of the values according to the present invention are given. Assuming that the reference voltage input bias line 11' having line capacitance of $3 \times 10^{-4}$ pF/μm² per unit area with a resistance value πs=50 mΩ per unit width and unit length, and having a width 1 μm×a length 100 μm has been produced through the element layout, the line capacitance becomes 0.03 pF and the line resistance of 5 Ω is produced.

Assuming that, where the current $I_f$ is 150 μA and the reference voltage generating circuit 18 is formed such that the potential of the reference voltage input bias line 11' is 4 V, the value 1 kΩ is obtained as the output impedance of the reference voltage generating circuit 18. Assuming that the sum of the gate capacitance of the transistor MNA1 and that of the transistor MNA2 are 1 pF, the time constant t of such reference voltage system is determined by a product of the output impedance of the reference voltage generating circuit 18 and the gate capacitances of the transistors MNA1 and MNA2.

That is, the time constant t is t=1 ns.

According to the invention, when the output impedance of the reference voltage generating circuit 18 is 1 kΩ, the line resistance of the reference voltage bias line 11' becomes 5 Ω. Thus, the extent corresponding to the line resistance is 1 kΩ>>5 Ω (about 0.5%), the extend corresponding to the line capacitance is 1 pF>>0.03 pF (about 3%) so that the influence of the line impedance to the time constant of the reference voltage input system may be considered negligible.

Figure 1:
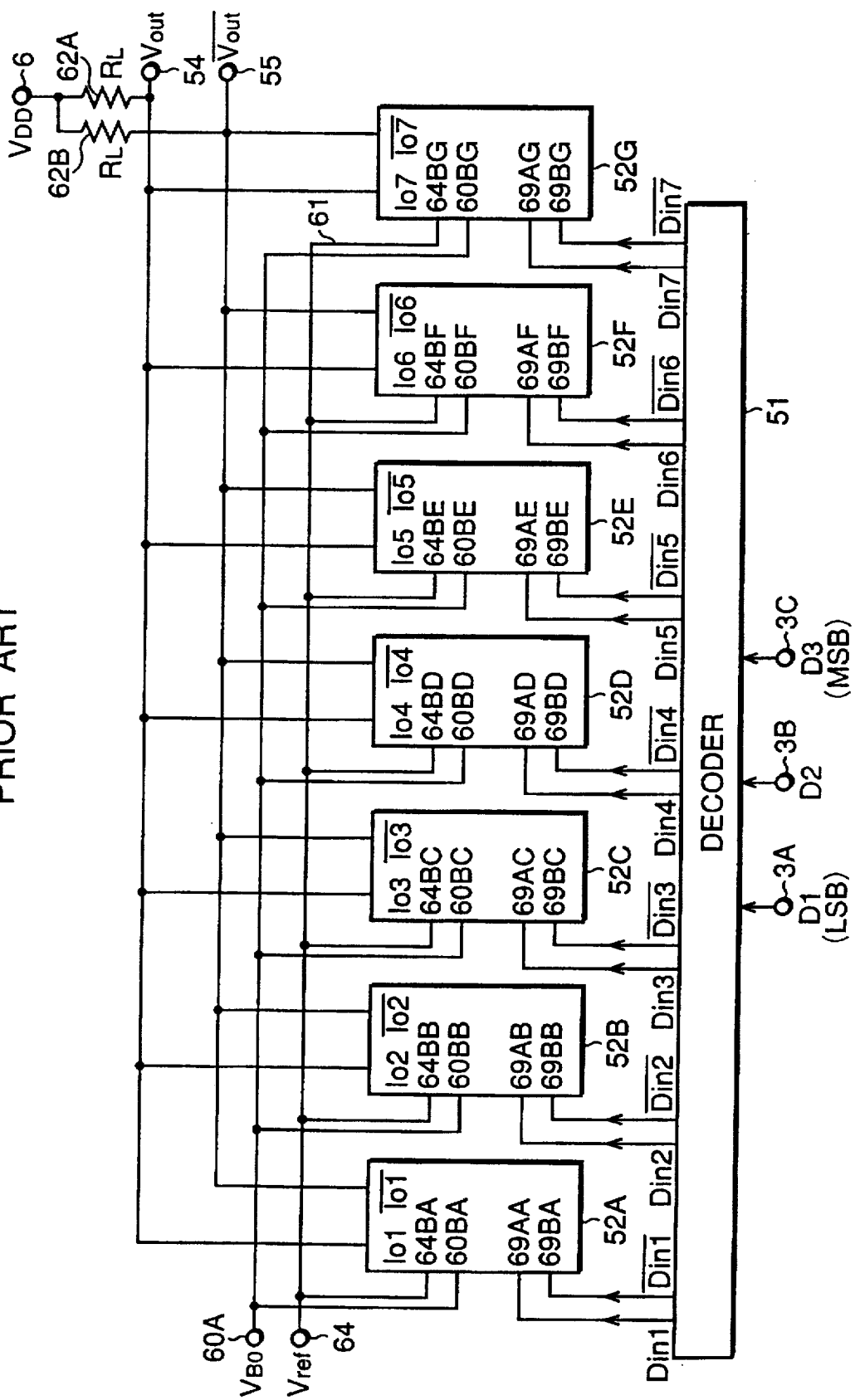
FIG. 1 is an overall block diagram of a first conventional D/A conversion device.

On the other hand, in the case of the conventional example shown in FIG. 1, if the value of the current to flow is made 7.4 mA which is 49 times the current in the reference voltage generating circuit 18 according to the present invention, and the output impedance is made 143 Ω (which is 1/7) (∴ gmf corresponds to (½) square of $I_f$), the line resistance and the line capacitance of the reference voltage input bias line 61 shown in FIG. 1 result in respectively about 46 Ω and 0.2 1 pF, which values are seven times since all the seven unit current generating circuits (52A–52G) are interconnected.

Figure 2:
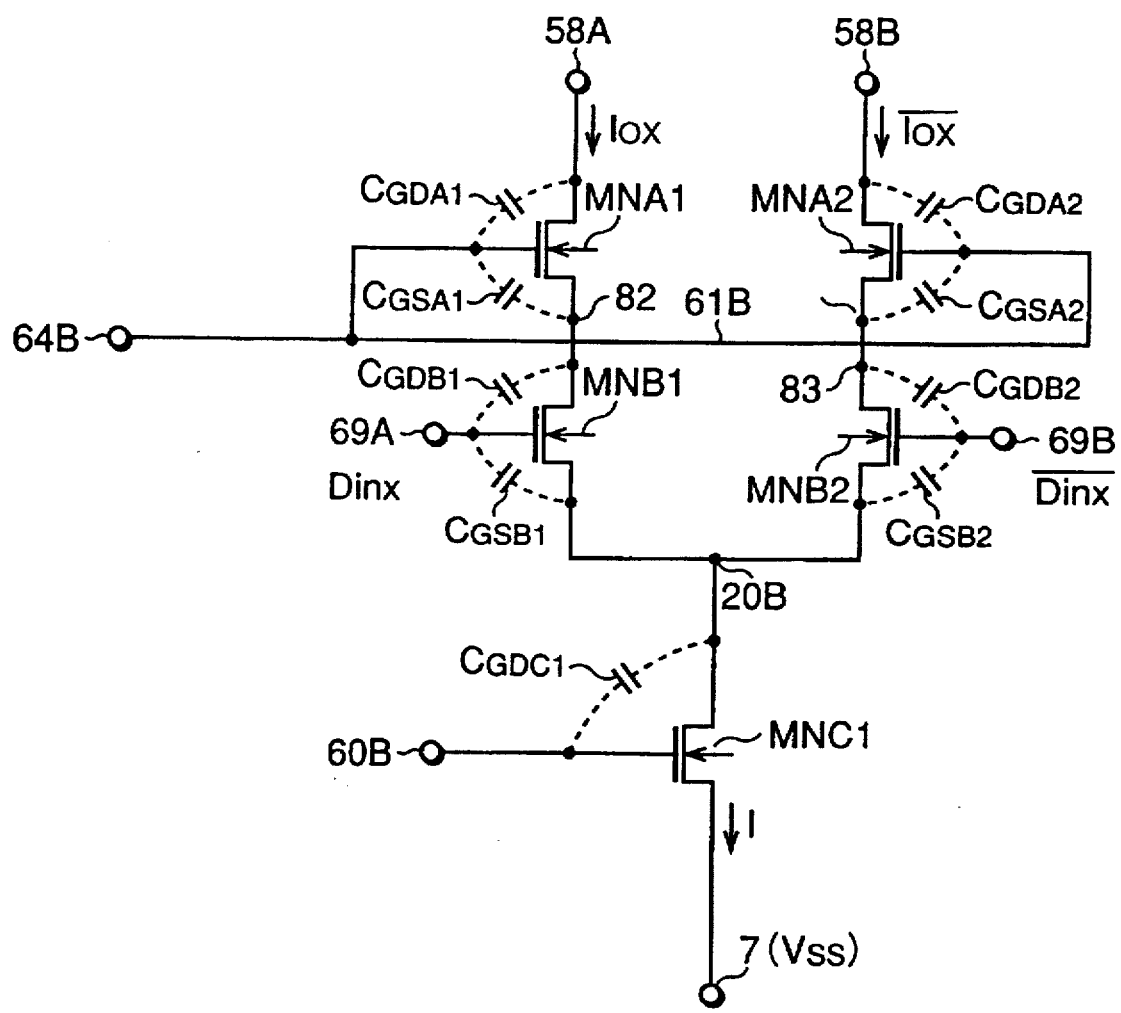
FIG. 2 is a circuit diagram of a unit current generating circuit in the conventional D/A conversion device shown in FIG. 1.

On the other hand, the gate capacitance of each of the transistors (MNA1 and MNA2) shown in FIG. 2 becomes 7 pF which is also seven times. In this case, the line capacitance 0.21 pF occupies about 3% of 7 pF which is the sum of the gate capacitances of the transistors MNA1 and MNA2, and this ratio is about the same as in the explained embodiment according to for the present invention. However, the line resistance is 35 Ω which is about 25% of the impedance 143 Ω in the reference voltage generating circuit and is not a negligible value.

As a result, the time constant t' of the reference voltage input system becomes t'=(143 Ω+35 Ω)×7 pF=1.25 ns. Therefore, in the case where the reference voltage generating circuit as employed by the present invention is used in the conventional example, it can be appreciated that, despite that the $I_f$ is made 49 times, the time constant of the reference voltage input system is slower by 25%. When the conventional example and the present invention are thus compared, it is clear that the time constant of the reference voltage system can be made small more readily and that the influence of the line impedance of the reference voltage input bias line 11' is smaller.

That is, as compared with the conventional example, it is possible to make shorter the time in which the reference input voltage $V_{ref}$ potential restores to the steady-state with respect to the spike noise which is caused by the differential switching of the digital signal DinX and its complementary DinX outputted from the decoder 1.

Figure 13:
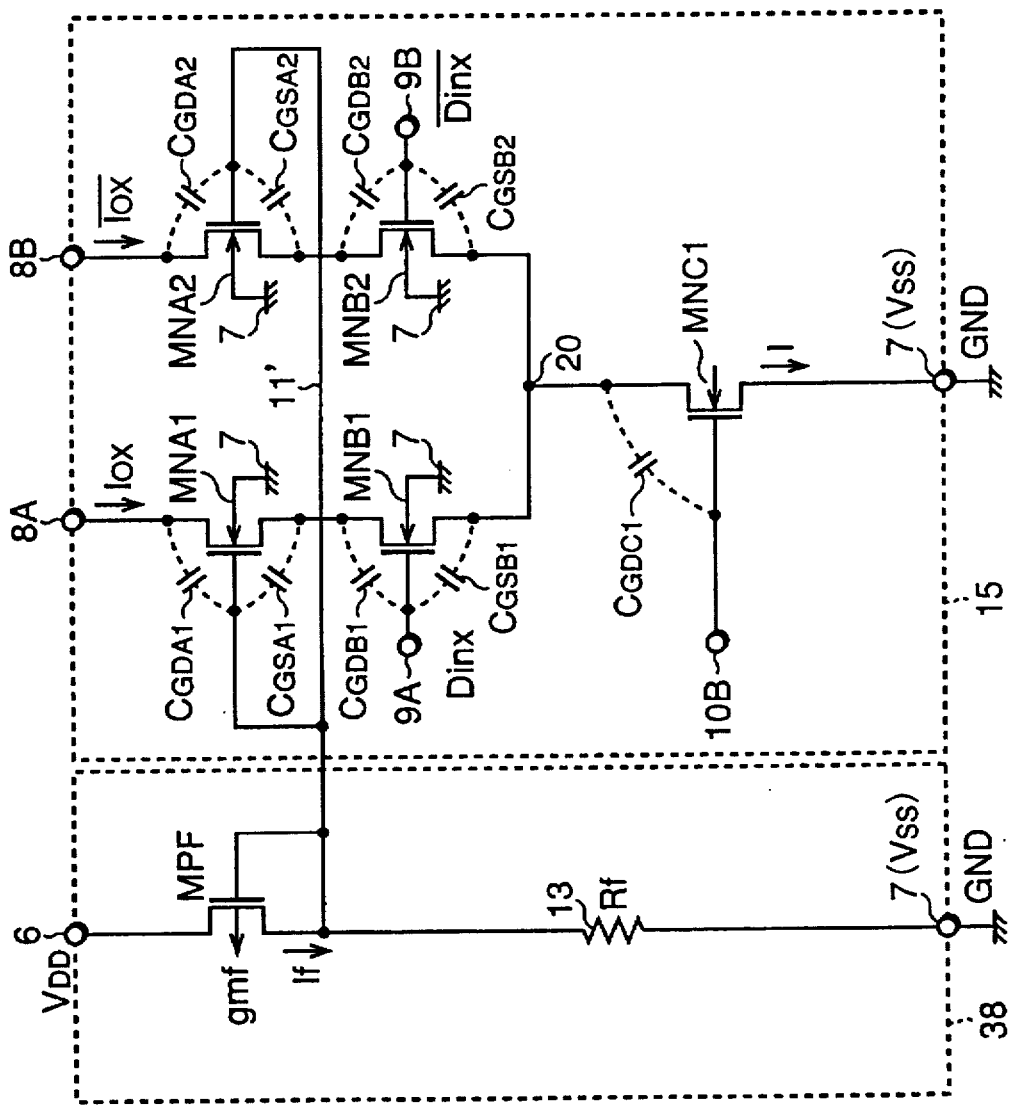
FIG. 13 is an overall block diagram of a second D/A conversion device according to the invention.

Also, in the separate reference voltage input bias line 11' with which the input signal DinX and its complementary signal DinX do not operate, the effect that there is no occurrence of the spike noise contributes so that the rise time at the time t1 shown in FIGS. 13 and 3 can be made shorter than that in the conventional example. This results in enhancing the maximum conversion speed of the D/A converting device.

Next, a D/A converting device of a second embodiment according to the invention is briefly explained.

As shown in FIG. 13, this second embodiment is one in which the N-type load MOS transistor MNF in the reference voltage generating circuit 18 shown in FIG. 11 is replaced by the load resistor 13 and, for achieving exactly the same effect as in the first embodiment, it is set such that the reference voltage $V_{ref}$ is not caused to be changed by the change in the threshold value $V_T$ of the N-type MOS transistor. Also, the back gate of each of the N-type MOS switching transistors (MNB1 and MNB2) of the differential switching circuit 15 is connected to the ground terminal 7 so that the back gate capacitance of each of the transistor MNB1 and the transistor MNB2 is not added to the capacitance at the node 20. Further, the back gates of the N-type fixed bias MOS transistors (MNA1 and MNA2) are also connected to the ground terminal 7 so that, by the rise of the threshold value because of the back gate effects, it is enabled to take a large analog output compliance.

Figure 14:
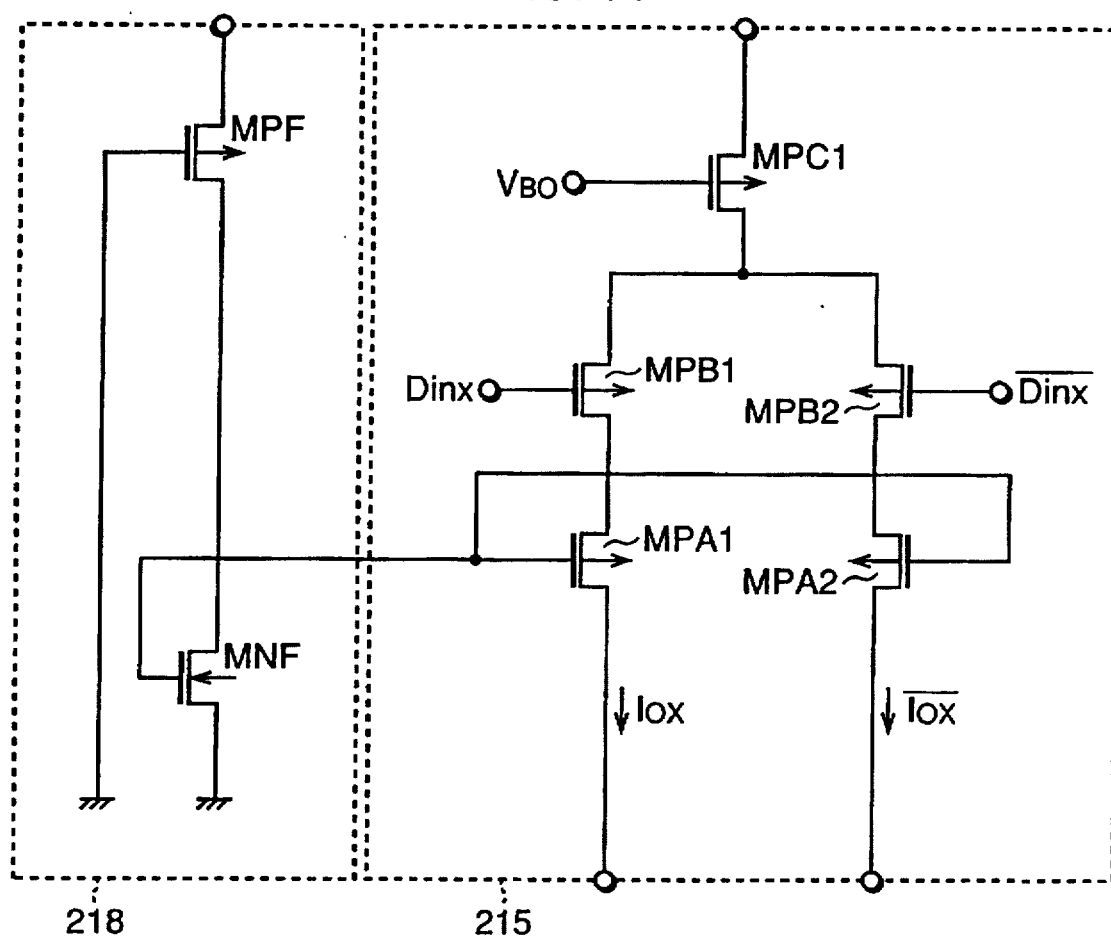
FIG. 14 is a circuit diagram for illustrating a configuration in which a unit current generating circuit of the D/A conversion device of the first embodiment according to the invention is formed on a P-type semiconductor substrate.

With reference to the above embodiments of the invention, the D/A converting device has been explained as being applied to the N-type semiconductor substrate, it is to be understood that the invention may be applied to the P-type semiconductor substrate thereby achieving the same effects as those explained. Such circuit configuration is shown in FIG. 14, but the detailed explanation is omitted.

Figure 15:
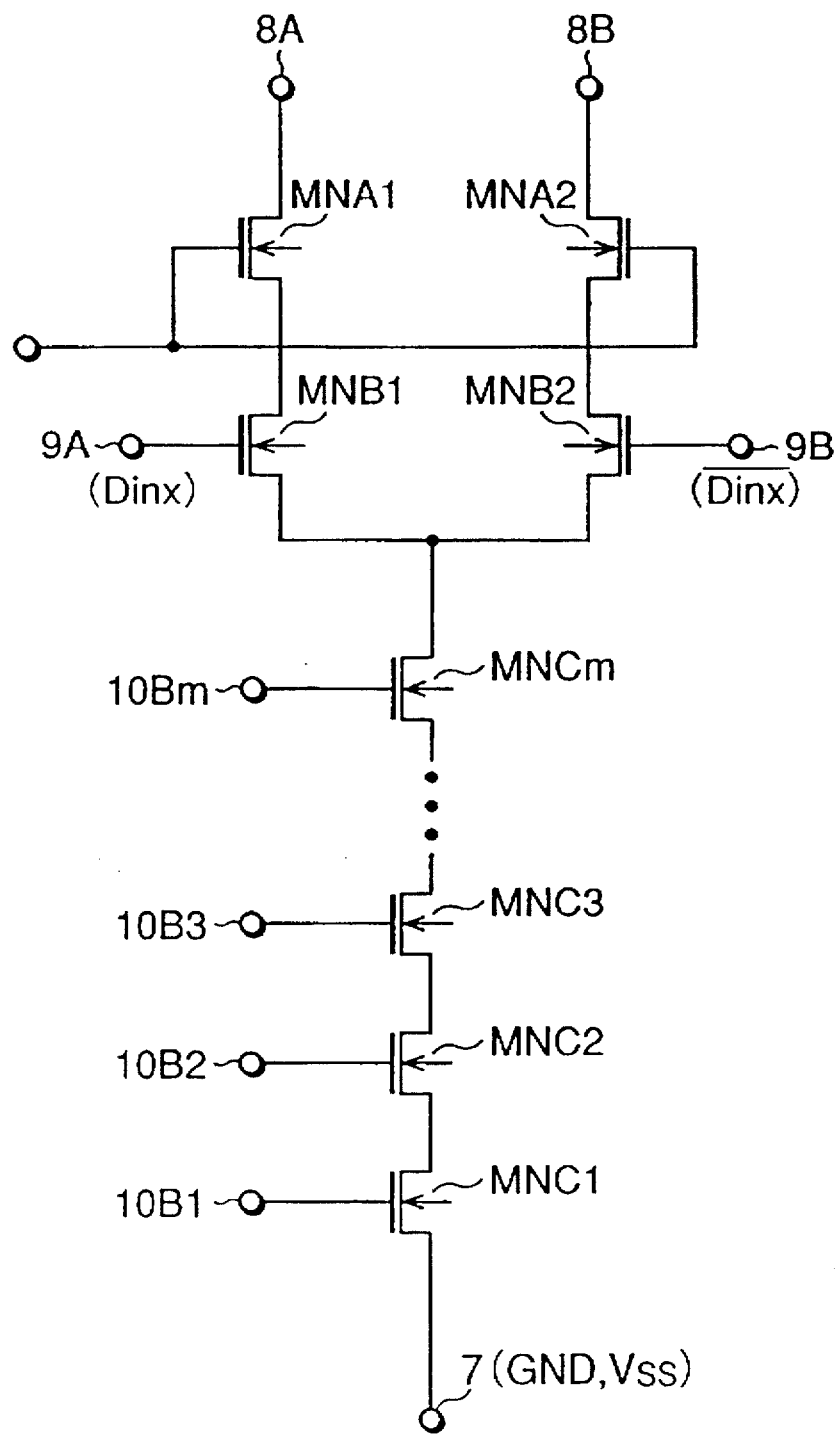
FIG. 15 is a circuit diagram of the constant current MOS transistor portion wherein a plurality of MOS transistors are connected in series.

Further, as shown in FIG. 15, a plurality of constant current MOS transistors MNC1–MNCm connected in series may be connected between the commonly connected sources of the differentially connected switching MOS transistors MNB1, MNB2 and the second power source terminal 8, that is, the ground potential terminal. In this case, the constant current MOS transistors MNC1–MNCm respectively receive at their gates the different bias voltages supplied to the respective constant bias input terminals 10B1–10Bm.

As explained above, in the D/A converting device according to the invention, the reference voltage source is provided in the unit current generating circuit so that the complex reference voltage source using an amplifier having low impedance characteristics and wide band characteristics as used in the conventional example can be omitted. Also, the invention enables the reduction of overshoot/undershoot in analog output waveforms at the full-swing operation and the shortening of the time for the fall or the rise in the output waveforms.

Thus, the advantage achieved is that the digital/analog conversion speeds are enhanced resulting as a result of speeding up of the settling time of the analog output waveforms.

Also, the analog output compliance VC may be expressed using the potential $V_{ref}'$ of the reference voltage input bias line 11' and the respective threshold values $V_{TH}$ of the transistor MNA1 and the transistor MNA2 as $VC=V_{DD}-V_{ref}'+V_{TH}$ so that, as the potential $V_{ref}'$ becomes smaller, the larger analog output compliance can be obtained.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A D/A converting device comprising:
    a first power supply terminal having a first potential and a second power supply terminal having a second potential which is different from said first potential;
    a decoder circuit which receives an n (n being a natural number larger than 0, n>0) bit digital input value of digital input signals inputted to input terminals and outputs a plurality of complementary pairs of digital signals corresponding to the digital input values of the n bits;
    a plurality of unit current generating circuits the number of which is same as that of the complementary pairs of the digital signals and which respectively receive said plurality of complementary pairs of digital signals, each of said unit current generating circuits comprising:
    a differential switching circuit having a complementary pair of input terminals to which one of said plurality of complementary pairs of the digital signals are inputted, a complementary pair of current output terminals, at least one bias voltage input terminal receiving a bias voltage, and a reference voltage input terminal receiving a reference voltage; and
    a reference voltage generating circuit connected to said first power supply terminal and generating said reference voltage supplied to said differential switching circuit;
    a complementary pair of analog output terminals to each of which corresponding current output terminals of said plurality of unit current generating circuits are commonly connected; and
    a pair of load circuits respectively connected between said complementary pair of the output terminals and said first power supply terminal, whereby analog output voltages corresponding to the n bit digital input value of the digital input signals applied to said input terminals are obtained at said complementary pair of the analog output terminals.

2. A D/A converting device according to claim 1, in which said differential switching circuit comprises:
    a first constant current MOS transistor which has a source connected to the second power source terminal and a gate connected to said bias voltage input;
    a pair of first and second MOS switching transistors of the same conductivity type as that of said first constant current MOS transistor, which have sources commonly connected to a drain of said first constant current MOS transistor, gates respectively connected to said complementary pair of digital outputs of said decoder; and
    a pair of first and second fixed bias MOS transistors of the same conductivity type as that of said first constant current MOS transistor, said first and second fixed bias MOS transistors having sources respectively connected to the drains of said first and second MOS switching transistors, drains respectively connected to said complementary pair of current output terminals that are connected to said complementary pair of analog output terminals, and gates to which the reference voltage is commonly applied so that said first and second fixed bias MOS transistors are constantly kept at conductive states.

3. A D/A converting device according to claim 2, in which said first constant current MOS transistor is constituted by a plurality of MOS transistors connected in series each of which receives at their gates different bias voltages.

4. A D/A converting device comprising:
    a first power supply terminal having a first potential and a second power supply terminal having a second potential which is lower than said first potential;
    a decoder circuit which receives an n (n being a natural number larger than 0, n>0) bit digital input value of digital input signals inputted to input terminals and outputs a plurality of complementary pairs of digital signals corresponding to the digital input values of the n bits;
    a plurality of unit current generating circuits the number of which is same as that of the complementary pairs of the digital signals and which respectively receive said plurality of complementary pairs of digital signals, each of said unit current generating circuits comprising:
    a differential switching circuit having a complementary pair of input terminals to which one of said plurality of complementary pairs of the digital signals are inputted, a complementary pair of current output terminals, at least one bias voltage input terminal, and a reference voltage input terminal; and a reference voltage generating circuit connected to said differential switching circuit;

a complementary pair of analog output terminals to each of which corresponding current output terminals of said plurality of unit current generating circuits are commonly connected; and a pair of load circuits respectively connected between said complementary pair of the output terminals and one of said first and second power supply terminals, whereby analog output voltages corresponding to the n bit digital input value of the digital input signals applied to said input terminals are obtained at said complementary pair of the analog output terminals;

said differential switching circuit comprises:

a first constant current MOS transistor which has a source connected to one of first and second power source terminals and a gate connected to said bias voltage input;

a pair of first and second MOS switching transistors of the same conductivity type as that of said first constant current MOS transistor, which have sources commonly connected to a drain of said first constant current MOS transistor, and gates respectively connected to said complementary pair of digital outputs of said decoder; and a pair of first and second fixed bias MOS transistors of the same conductivity type as that of said first constant current MOS transistor, said first and second fixed bias MOS transistors having sources respectively connected to the drains of said first and second MOS switching transistors, drains respectively connected to said complementary pair of current output terminals that are connected to said complementary pair of analog output terminals, and gates to which a reference voltage is commonly applied so that said first and second fixed bias MOS transistors are constantly kept at conductive states;

said reference voltage generating circuit comprises:

a second constant current MOS transistor of a conductivity type opposite to that of said first constant current MOS transistor, said second constant current MOS transistor having a source connected to one of said first and second power source terminals, the other of said first and second power source terminals being connected to the source of said first constant current MOS transistor, and a gate and a drain connected together so as to form an output node for outputting said reference voltage supplied to said differential switching circuit; and a load element connected between the drain of said second constant current MOS transistor and one of said first and second power source terminals.

5. A D/A converting device according to claim 4, in which said load element includes an active load with a MOS transistor having a drain connected to the drain of said second constant current MOS transistor, a source connected and one of said first and second power source terminals, and a gate receiving a potential substantially the same as that at the source of said second constant current MOS transistor.

6. A D/A converting device according to claim 4, in which said load element includes a load resistor connected between the drain of said second constant current MOS transistor and one of said first and second power source terminals.

7. A D/A converting device according to claim 1, in which said reference voltage generating circuit is constituted independently in each of said unit current generating circuits, and said reference voltage generating circuits output reference voltages that are respectively different from potentials supplied at said first and second power source terminals but are mutually substantially the same.

8. A D/A converting device having a decoder for decoding n-bit digital input signals to a plurality of complementary digital output signals and a plurality of unit current generating circuits respectively receiving said plurality of digital output signals, each of said plurality of unit current generating circuits comprising:

a differential switching circuit including a differentially connected first transistor pair receiving one of said plurality of complementary digital output signals and a differentially connected second transistor pair receiving a reference voltage, said differential switching circuit further comprising a complementary pair of input terminals to which one of said plurality of complementary pairs of the digital signals are inputted, a complementary pair of current output terminals, at least one bias voltage input terminal receiving a bias voltage, and a reference voltage input terminal receiving said reference voltage; and a reference voltage generating circuit which produces said reference voltage and is provided independently to each of said unit current generating circuits.

* * * * *

UNITED STATES PATENT AND TRADEMARK OFFICE
CERTIFICATE OF CORRECTION

PATENT NO. : 5,696,512
DATED : December 9, 1997
INVENTOR(S) : Tomio TAKIGUCHI

It is certified that error(s) appears in the above-identified patent and that said Letters Patent is hereby corrected as shown below:

Column 1, line 49, change "MNB2" to --MNA2--;

Column 5, line 52, change "20" to --220--.

Signed and Sealed this

Twenty-eighth Day of July, 1998

Attest:

BRUCE LEHMAN

*Attesting Officer*  *Commissioner of Patents and Trademarks*